US009431339B2

(12) United States Patent
Kirihata et al.

(10) Patent No.: US 9,431,339 B2
(45) Date of Patent: Aug. 30, 2016

(54) WIRING STRUCTURE FOR TRENCH FUSE COMPONENT WITH METHODS OF FABRICATION

(71) Applicant: International Business Machines Corporation, Armonk, NY (US)

(72) Inventors: Toshiaki Kirihata, Poughkeepsie, NY (US); Edward P. Maciejewski, Wappingers Falls, NY (US); Subramanian S. Iyer, Mount Kisco, NY (US); Chengwen Pei, Danbury, CT (US); Deepal U. Wehella-Gamage, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 113 days.

(21) Appl. No.: 14/184,003

(22) Filed: Feb. 19, 2014

(65) Prior Publication Data

US 2015/0235945 A1    Aug. 20, 2015

(51) Int. Cl.
*H01L 23/525* (2006.01)
*H01L 21/768* (2006.01)
*H01L 21/84* (2006.01)
*H01L 27/12* (2006.01)

(52) U.S. Cl.
CPC ..... *H01L 23/5256* (2013.01); *H01L 21/76886* (2013.01); *H01L 21/84* (2013.01); *H01L 23/5252* (2013.01); *H01L 27/1203* (2013.01); *H01L 2924/0002* (2013.01)

(58) Field of Classification Search
CPC ............. H01L 23/525; H01L 23/5252; H01L 23/5256; H01L 23/62; H01L 27/11206
USPC .................. 257/529; 438/132, 467
See application file for complete search history.

(56) References Cited

U.S. PATENT DOCUMENTS

| | | | | |
|---|---|---|---|---|
| 5,282,158 | A * | 1/1994 | Lee | H01L 23/5252 257/529 |
| 7,205,587 | B2 | 4/2007 | Fujimaki | |
| 7,381,594 | B2 * | 6/2008 | Hsu | H01L 23/5256 257/E21.347 |
| 7,910,419 | B2 | 3/2011 | Fenouillet-Beranger et al. | |

(Continued)

FOREIGN PATENT DOCUMENTS

JP    H03279250 A    12/1991
JP    2003515236 A    4/2003

OTHER PUBLICATIONS

Diaz. Notice of Allowance and Fees Due for U.S. Appl. No. 14/876,009; Dated May 25, 2016; 16 pages.

*Primary Examiner* — Jose R Diaz
(74) *Attorney, Agent, or Firm* — Steven J. Meyers; Hoffman Warnick LLC (57) ABSTRACT

The present disclosure generally relates to a wiring structure for a fuse component and corresponding methods of fabrication. A wiring structure for a fuse component according to the present disclosure can include: a first electrical terminal embedded within a doped conductive layer, the doped conductive layer being positioned between two insulator layers of an integrated circuit (IC) structure; a dielectric liner positioned between the first electrical terminal and the doped conductive layer; a second electrical terminal embedded within the doped conductive layer; wherein each of the first electrical terminal and the second electrical terminal are further embedded in one of the two insulator layers, and the dielectric liner is configured to degrade upon becoming electrically charged.

20 Claims, 10 Drawing Sheets

(56) References Cited

U.S. PATENT DOCUMENTS

| | | | |
|---|---|---|---|
| 7,977,766 B2* | 7/2011 | Booth, Jr. | H01L 23/5252 |
| | | | 257/530 |
| 8,383,256 B1 | 2/2013 | Fu | |
| 2002/0115240 A1 | 8/2002 | Assaderaghi et al. | |
| 2007/0273002 A1* | 11/2007 | Hwang | H01L 23/5256 |
| | | | 257/529 |
| 2012/0135566 A1 | 5/2012 | Pinguet et al. | |

* cited by examiner

WIRING STRUCTURE FOR TRENCH FUSE COMPONENT WITH METHODS OF FABRICATION

BACKGROUND

Embodiments of the disclosure relate generally to integrated circuits and, more particularly, to the wiring structure of a trench fuse component and corresponding methods of fabrication.

Many integrated circuits include millions of interconnected devices, such as transistors, resistors, capacitors, and diodes, on a single chip of a semiconductor substrate. Semiconductor integrated circuits can also include one or more types of memory, such as CMOS memory, antifuse memory, and fuse memory.

Some electrically programmable components of an electronic circuit can include fuses and antifuses. Fuses generally include a region of conductive material between two electrical contacts. The conductive material can be destroyed to become non-conductive when exposed to a threshold level of voltage or current. This process can be referred to as "programming" or "fusing" the fuse. Conversely, an "antifuse" refers to an integrated circuit structure in which two electrically conductive terminals are separated from each other by one or more regions composed of an electrically insulative material. Electric current can be permitted to flow between the two terminals by materially altering or destroying the regions of electrically insulative material. By transforming an electrically insulative region into an electrically conductive region, "programming" or "fusing" an antifuse can serve the opposite purpose of a programmable fuse.

Some IC components, including fuses and antifuses, can be in the form of a "deep trench" component. Generally, a "deep trench" component refers to an electrical component embedded at least partially within a buried insulator layer of a semiconductor-on insulator (SOI) structure. As IC structures have become smaller, fuse and antifuse structures have been used increasingly as a form of non-volatile memory. In particular, fuse and antifuse memory can permanently store certain items of unit-specific data such as serial numbers. Design considerations for fuses and e-fuses include decreasing the size of these components to accommodate a greater number of components in an IC structure, and increasing their versatility.

SUMMARY

A first aspect of the present disclosure includes a wiring structure for a trench fuse component, the wiring structure comprising: a first electrical terminal embedded within a doped conductive layer, the doped conductive layer being positioned between two insulator layers of an integrated circuit (IC) structure; a dielectric liner positioned between the first electrical terminal and the doped conductive layer; a second electrical terminal embedded within the doped conductive layer; wherein each of the first electrical terminal and the second electrical terminal are further embedded in one of the two insulator layers, and the dielectric liner is configured to degrade upon becoming electrically charged.

A second aspect of the present disclosure includes a method of fabricating a trench fuse component, the method comprising: forming a first insulator layer between a doped conductive layer and an oppositely doped substrate of an integrated circuit (IC) structure, such that no p-n junction exists between the oppositely doped substrate and the doped conductive layer; forming a first electrical terminal within the doped conductive layer, wherein the first electrical terminal includes a dielectric liner thereon; and forming a second electrical terminal within the doped conductive layer.

A third aspect of the present disclosure includes a trench antifuse structure comprising: a substrate; a first insulator layer positioned adjacent to the substrate; a doped conductive layer positioned adjacent to the first insulator layer; a second insulator layer positioned adjacent to the doped conductive layer; a semiconductor-on-insulator (SOI) layer positioned adjacent to the second insulator layer; a first electrical terminal embedded within the doped conductive layer, the second insulator layer, and the SOI layer; a dielectric liner positioned between the first electrical terminal and the doped conductive layer; and a second electrical terminal embedded within the doped conductive layer, the second insulator layer, and the SOI layer; wherein the dielectric liner is configured to degrade upon becoming electrically charged.

BRIEF DESCRIPTION OF THE SEVERAL VIEWS OF THE DRAWINGS

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Features of the present disclosure include a wiring structure for a trench or "deep trench" fuse component. A wiring structure according to the present disclosure can include a doped conductive layer positioned between two insulator layers of an integrated circuit (IC) structure. Positioning the doped conductive layer between two insulator layers of an IC structure can prevent p-n junctions from forming between the doped conductive layer and any semiconductor layers of the structure. Thus, embodiments of the present disclosure can prevent parasitic diodes caused by p-n junctions from forming within the conductive portions of a fuse structure The doped conductive layer can also separate a first electrical terminal from a second electrical terminal. A dielectric liner of the trench, configured to degrade after being electrically charged, can be positioned between the doped conductive layer and the first electrical terminal. To program a fuse component with this wiring structure, a user can electrically charge the first electrical terminal to degrade the dielectric liner, thereby allowing electrical current to flow between the first and second electrical terminals. In addition, as discussed herein, wiring structures of a trench or "deep trench" fuse component can include an isolation ring for separating the trench fuse component from other components of an IC structure.

Figure 1:
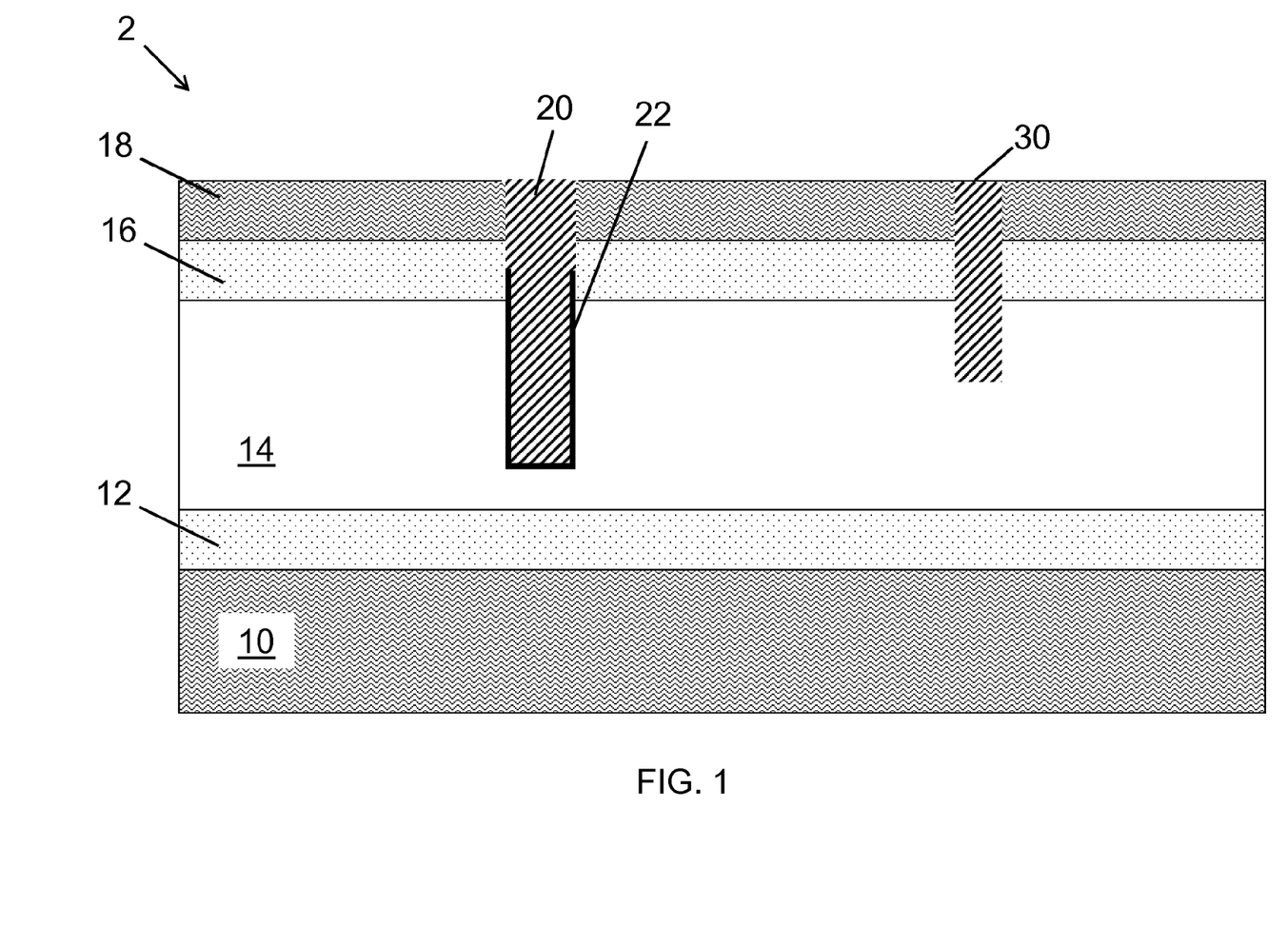
FIG. 1 shows a cross-sectional side view of a wiring structure for a fuse component according to an embodiment of the present disclosure.

Turning to FIG. 1, a cross-sectional side view of a wiring structure 2 for a fuse component is shown. Wiring structure 2 can be part of a larger integrated circuit (IC) structure, and may form part of a fuse or antifuse component. Wiring structure 2 can include a substrate 10 positioned adjacent to a first insulator layer 12. A doped conductive layer 14 can be positioned between first insulator layer 12 and a second insulator layer 16. As is known in the art, "doping" refers to a process by which an impurity or "dopant" is introduced into a semiconductive material to alter its electrical properties, e.g., the conductivity and resistivity of a material. Doped conductive layer 14 can be composed of any currently known or later developed material capable of being doped, such as a semiconductor material. As examples, doped conductive layer 14 can be composed of polysilicon, silicon germanium, or a conductive organic material, and may be doped either p-type or n-type. Substrate 10 can also be composed of a doped semiconductor material, and may be doped oppositely from doped conductive layer 14. For example, substrate 10 may be doped p-type where doped conductive layer 14 is doped n-type, and vice-versa. The doping of doped conductive layer 14 can increase the electrical conductivity of its material composition, thereby allowing electrical currents to travel through doped conductive layer 14. First and second insulator layers 12, 16 can be composed of any material which substantially prevents the flow of electric current therethrough, e.g., substances including but not limited to: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof. In some embodiments, first insulator layer 12 and second insulator layer 16 may include an oxide, and thus may be referred to as "buried oxide" (BOX) layers. A semiconductor-on-insulator (SOI) layer 18 can be positioned adjacent to second insulator layer 16. The material composition of substrate 10 and/or SOI layer 18 can include, e.g., silicon, germanium, silicon germanium, silicon carbide, and substances consisting essentially of one or more III-V compound semiconductors having a composition defined by the formula $Al_{x1}Ga_{x2}In_{x3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion of substrate 10 and/or SOI layer 18 may be strained.

Wiring structure 2 can include several electrically conductive and insulative components as shown in FIG. 1 by way of example. A first electrical terminal 20 can be embedded within doped conductive layer 14. First electrical terminal 20 can extend through second insulator layer 16 and/or SOI layer 18. First electrical terminal 20 can be composed of any currently known or later developed conductive material, such as a metal, in addition to other materials discussed herein. If desired, at least a portion of first electrical terminal 20 can be composed of the same material or a similar material as doped conductive layer 14, such as polysilicon, silicon germanium, and/or a conductive organic material.

A first dielectric liner 22 can be positioned between first electrical terminal 20 and doped conductive layer 14. First dielectric liner, similar to first insulator layer 12 and second insulator layer 16, may be composed of an electrically insulative material which substantially blocks the flow of electrical current between first electrical terminal 20 and doped conductive layer 14. First dielectric liner can completely occupy the space between first electrical terminal 20 and doped conductive layer 14. In an embodiment, first dielectric liner 22 can be composed of a material having a dielectric constant of at least 3.9, such as metal oxides, tantalum oxide ($Ta_2O_5$), barium titanium oxide ($BaTiO_3$), hafnium oxide ($HfO_2$), zirconium oxide ($ZrO_2$), aluminum oxide ($Al_2O_3$) or metal silicates such as hafnium silicate oxide ($Hf_{A1}Si_{A2}O_{A3}$) or hafnium silicate oxynitride ($Hf_{A1}Si_{A2}O_{A3}N_{A4}$), where A1, A2, A3, and A4 represent relative proportions, each greater than or equal to zero and A1+A2+A3+A4 (1 being the total relative mole quantity). First dielectric liner 22, by having a material composition with a dielectric constant of at least approximately 3.9 and a thickness of, e.g., between approximately 1 nm and approximately 10 nm, or between approximately 3 nm and approximately 6 nm, can degrade, migrate, break down, etc. when exposed to an electric current yielded from a particular power supply (e.g., at least approximately 2 V). First dielectric liner 22 can also be composed of other currently known or later developed insulator materials with similar properties. In addition, it is understood that other portions of first electrical terminal 20 can be coated with other types of liners to reduce the flow of electrical current from first electrical terminal 20 into other parts of wiring structure 2, but these additional liners are omitted from the accompanying figures for clarity.

A second electrical terminal 30, which may be known in the art and equivalently referred to as a "substrate contact," can also be embedded within doped conductive layer 14. In an embodiment, second electrical terminal 30 can be embedded within doped conductive layer 14 by extending through second insulator layer 16, and SOI layer 18. Second electrical terminal 30 can be composed of an electrically conductive material, such as a metal, and can be electrically coupled to doped conductive layer 14. First electrical terminal 20 and second electrical terminal 30 together can function as the two contacts of an antifuse structure, with doped conductive layer being an electrically conductive region electrically coupling first and second electrical terminals 20, 30. It is understood that wiring structure 2 can include more than two electrical terminals if desired, and that additional terminals can be similar to first and second electrical terminals 20, 30, or can be in the form of any other currently known or later developed electrical terminal. First dielectric liner 22 can substantially block the electrical pathway between first electrical terminal 20 and second electrical terminal 30. However, other components discussed herein can allow a user to degrade, move, or otherwise disable electrically insulative portions of dielectric liner 22 to allow electric current to flow between first electrical terminal 20 and second electrical terminal 30. In addition, it is understood that other portions of second electrical terminal 30 can be coated with other types of liners to reduce the flow of electrical current from second electrical terminal 30 into other parts of wiring structure 2, but these additional liners are omitted from the accompanying figures for clarity. It is further understood that by reversing the logic levels of the integrated circuit (e.g., zero representing "high voltage" and one representing "low voltage"), wiring structure 2 can effectively be used in a fuse instead of an antifuse.

Embodiments of the present disclosure can be programmed by using a power supply with a particular voltage bias. Separating doped conductive layer 14 from substrate 10 and SOI layer 18 with first and second insulator layer 12, 16 can prevent p-n junctions from forming between doped conductive layer 14 and other components of wiring structure 2, such as substrate 10 and SOI layer 18. The absence of a p-n junction between doped conductive layer 14 and either substrate 10 or SOI layer 18 can allow a power supply coupled to first or second electrical terminals 20, 30 to have a negative voltage bias of, e.g., −2 V, −3 V, or an even lower negative voltage bias. Other fuse structures, in contrast, may not be programmable with negatively biased power supplies of this magnitude. Thus, embodiments of the present disclosure contemplate applying a negative voltage to second electrical terminal 30, which can result in a low positive voltage to first electrical terminal 20 while maintaining a particular voltage condition between first and second electrical terminals 20, 30. First and second insulator layers 12, 16 together can isolate wiring structure 2 from other components of an integrated circuit (IC) structure to maintain the particular voltage condition without any parasitic effect by other electrical components.

Figure 2:
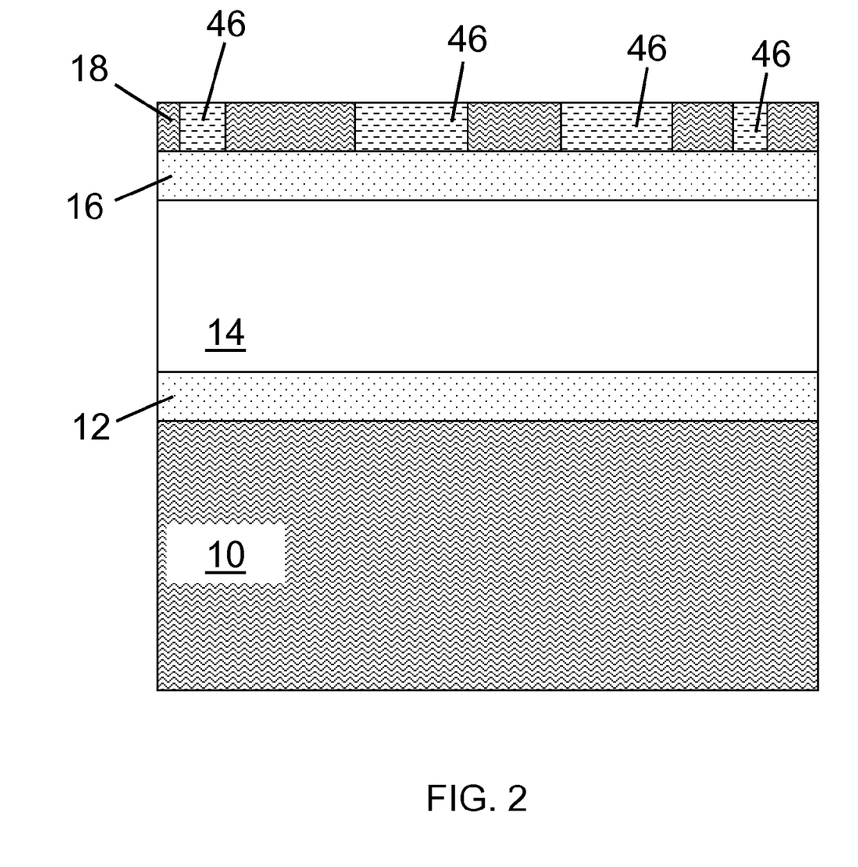
FIGS. 2 and 3 show cross-sectional side views of a fuse component undergoing processes according to embodiments of the present disclosure.

Turning to FIG. 2, a process according to the present disclosure is shown. Processes discussed herein can be used to fabricate a fuse component of an IC structure, which can include embodiments of wiring structure 2 (FIG. 1). Methods according to the present disclosure can include forming first insulator layer 12 between doped conductive layer 14 and substrate 10. First insulator layer 12, which can be composed of an oxide material or another material capable of being deposited, can be formed by depositing a layer of oxide or another insulator material onto the surface of a silicon wafer. The silicon wafer or other material used for substrate 10 may be doped to have a desired polarity, e.g., p-type or n-type doping. Doped conductive layer 14 can also be formed adjacent to first insulator layer 12. To form doped conductive layer 14, a semiconductive material such as polysilicon, silicon germanium, or a conductive organic material can be formed (e.g., by deposition), and then doped by using any currently known or later developed process of doping a semiconductive material. Where substrate 10 has been doped, doped conductive layer 14 can be doped to have the opposite polarity from substrate 10. First insulator layer 12 can separate doped conductive layer 14 from substrate 10 to prevent a p-n junction from forming between substrate 10 and doped conductive layer 14. As also shown in FIG. 2, second insulator layer 16 may be formed adjacent to doped conductive layer 14 by the same process or a similar process as was used to form first insulator layer 12.

SOI layer 18 can also be formed adjacent to second insulator layer 16, e.g., by creating or obtaining a "donor wafer" of the material used for SOI layer 18 and applying a currently known or later developed bonding process to bond SOI layer 18 to second insulator layer 16. It is therefore noted that adhesive materials may be present between the various layers discussed herein. However, adhesive materials which may be used in processes of the present disclosure are omitted from the accompanying drawings for clarity. In addition or alternatively, SOI layer 18 can be formed by other processes currently known or later developed, such as deposition. As a result, first insulator layer 12 and second insulator layer 16 can isolate doped conductive layer 14 from substrate 10 and SOI layer 18. Electrically isolating doped conductive layer 14 from substrate 10 and SOI layer 18 can prevent a p-n junction from being present between doped conductive layer 14 and other components separated from doped conductive layer 14 by first and second insulator layers 12, 16.

To electrically isolate some of the components of wiring structure 2 (FIG. 1), e.g., first electrical terminal 20 and/or second electrical terminal 30 shallow trench isolations (STIs) 46 can be formed by removing portions of SOI layer 18 and depositing electrically insulative materials within the removed portions. Each STI 46 can be formed, e.g., where first electrical terminal 20 and second electrical terminal 30 can be placed within wiring structure 2 (FIG. 1).

Figure 3:
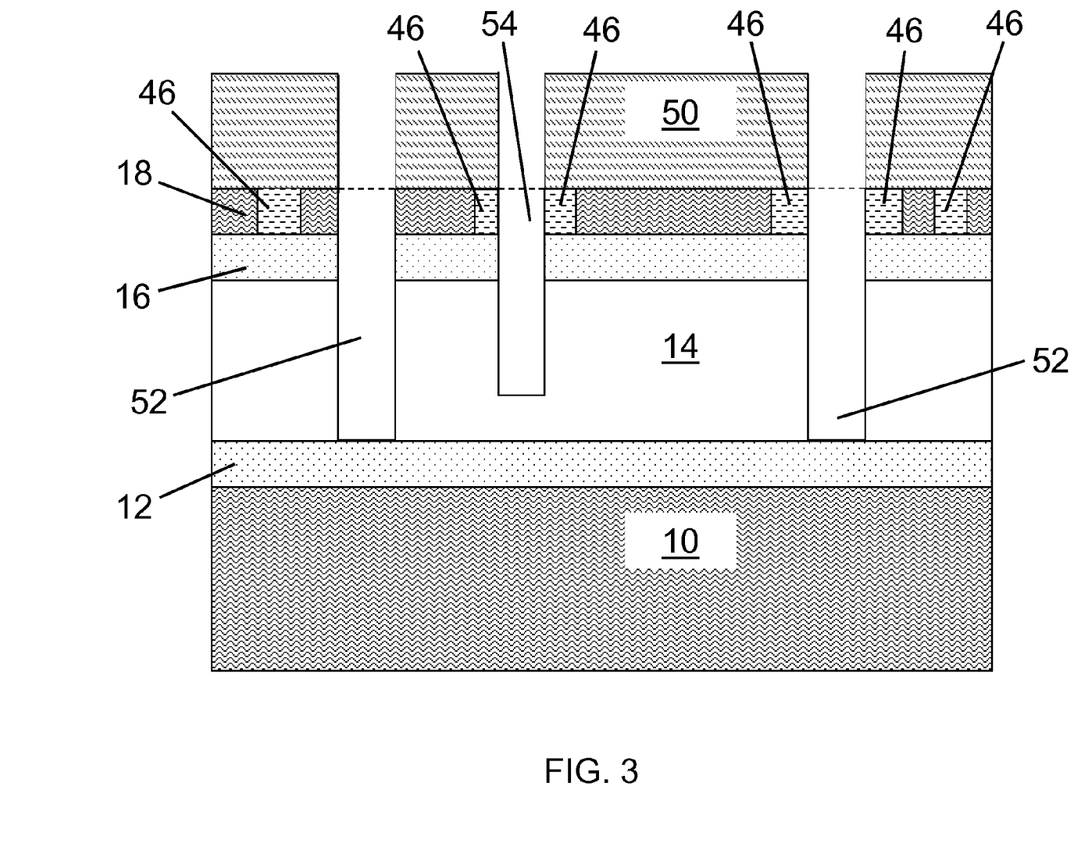
Figure 4:
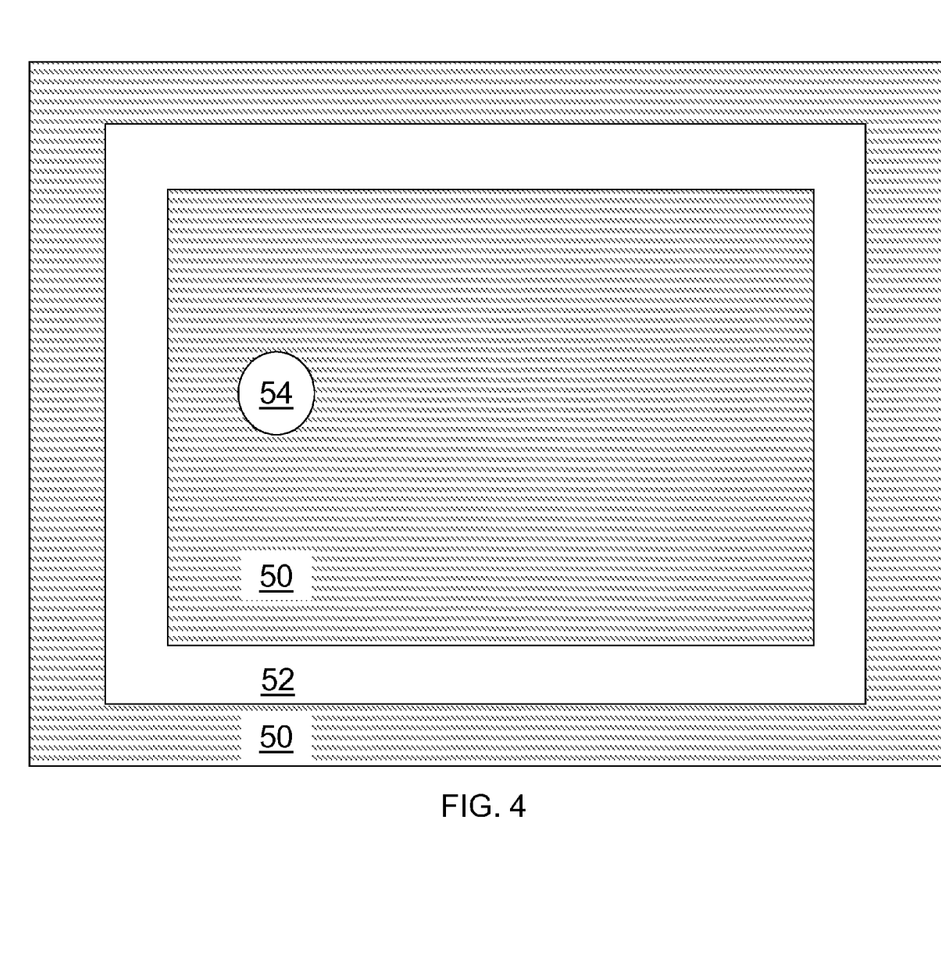
FIG. 4 shows a top-down view of a fuse component undergoing a process according to an embodiment of the present disclosure.

Turning to FIGS. 3 and 4, methods of the present disclosure can also include forming a first electrical terminal 20 (FIG. 1) and an isolation ring 56 (discussed below with reference to FIG. 5) within doped conductive layer 14. First electrical terminal 20 (FIG. 1) can be externally lined with first dielectric liner 22 (FIG. 1) First electrical terminal 20 (FIG. 1) can be formed by any currently known or later developed process of forming and/or embedding a component within an IC structure. As an example, FIGS. 3 and 4 show a photomask 50 which can be deposited onto SOI layer 18. Using photomask 50, a trench 52 can be etched into SOI layer 18, second insulator layer 16, and doped conductive layer 14 to any desired depth. As shown in FIG. 4, trench 52 can be a continuous "moat," "trench," "deep trench" or loop which encloses a cross-sectional area of an IC structure. Thus, trench 52 is shown in FIG. 3 as being in two parts of one cross section. It is understood in the art of IC technology that a "trench" can extend through one or several layers an IC structure. Different shapes and structures of trench 52 are also contemplated, and can be formed by using different types of photomasks 50. In addition, a terminal opening 54 can be etched into SOI layer 18, second insulator layer 16, and doped conductive layer 14 to any desired depth. Further, it is understood that trench 52 and terminal opening 54 can be etched through first insulator layer 12 and substrate 10 if desired. The forming of trench 52 and/or terminal opening 54 can be completed by any currently known or later developed process for removing a material, such as etching. Specifically, the etching can be performed by "reactive ion etching," (RIE), a variation of plasma etching in which, during etching, a semiconductor wafer is placed on an RF powered electrode. Throughout RIE, the wafer may take on an electric potential which accelerates the etching species extracted from plasma toward the etched surface. Trench 52 and terminal opening 54 can be formed sequentially or simultaneously, and generally can be formed before or after the forming of other components discussed herein.

Figure 5:
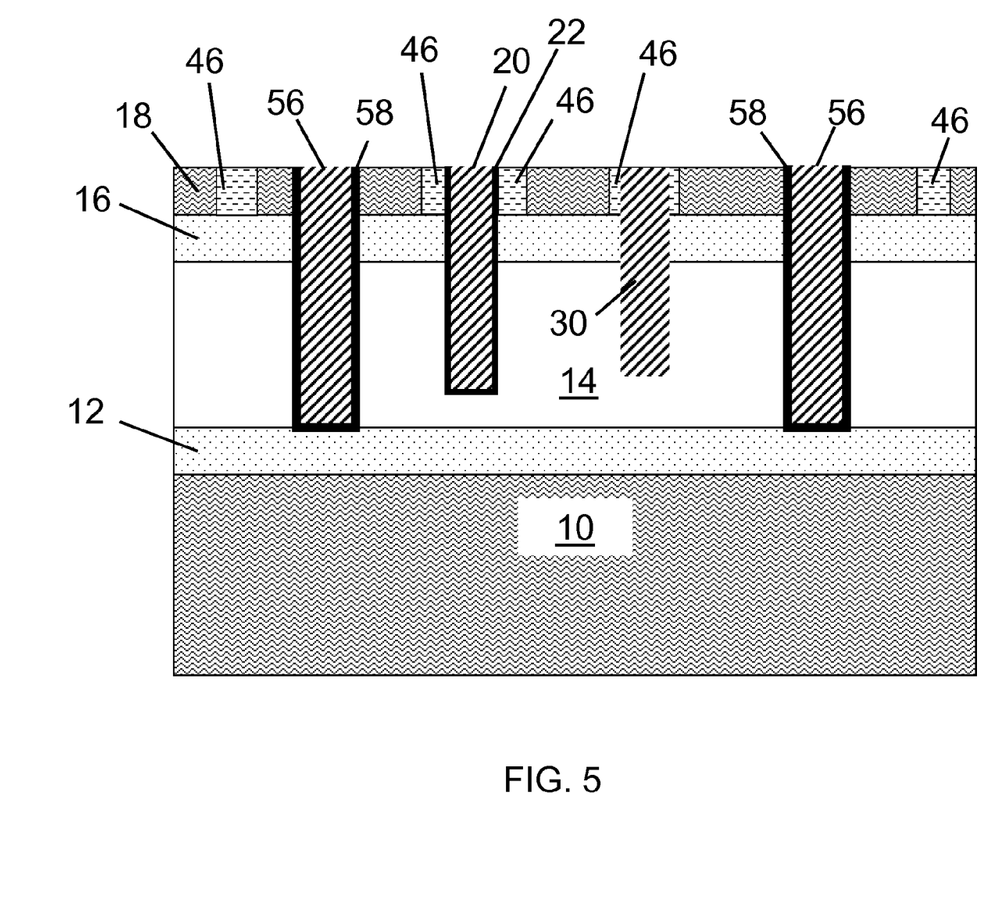
FIGS. 5-8 show cross-sectional side views of a fuse component undergoing processes according to embodiments of the present disclosure.

Turning now to FIG. 5, embodiments of the present disclosure can include filling trench 52 (FIG. 3) and terminal opening 54 (FIG. 3). First dielectric liner 22 can be formed within terminal opening 54 (FIG. 3) by lining dielectric material, e.g., a material or oxide having a dielectric constant of at least 3.9, within terminal trench 52 (FIG. 3). A conductive material such as a metal can then be deposited to form the structure of first electrical terminal 20. Excess materials remaining on SOI layer 18 after the forming or depositing of conductive material can be removed by any currently known or later developed process for removing a material, e.g., backgrinding, chemical mechanical polishing (CMP), or other forms of polishing.

The wiring structure disclosed herein can also include an isolation ring 56 embedded within doped conductive layer 14. As is known in the art, an "isolation ring" can generally refer to a structural material which blocks current flow between two or more distinct components of an IC structure. Isolation ring 56 can be composed of the same or similar electrically conductive materials as first and second electrical terminals 20, 30, and thus may act as an electrical connection between other components of an IC structure. Isolation ring 56 can also include a second dielectric liner 58, which can be positioned between isolation ring 56 and doped conductive layer 14 to substantially block the flow of electric current between doped conductive layer 14 and other components of an IC structure. Second dielectric liner 58 may be composed of any currently known or later developed insulating material, e.g., any material used to form first and second insulator layers 12, 16. In addition, it is understood that isolation ring 56 can be coated with other liner materials to reduce the flow of electrical current within isolation ring 56 into other parts of wiring structure 2 and/or to prevent degradation of second dielectric liner 58, but these additional liners are omitted from the accompanying figures for clarity. Second dielectric liner 58 can be formed within trench 52 (FIG. 3) by depositing dielectric material, e.g., an insulating material or oxide, therein. Isolation ring 56 can also be created by forming or depositing a conductive or non-conductive material within trench 52 (FIG. 3) by any other currently known or later developed process.

Processes of the present disclosure can also include forming second electrical terminal 30 within doped conductive layer 14, either before or after the forming of first electrical terminal 20 and isolation ring 56. Second electrical terminal 30 can be formed by any currently known or later developed process, e.g., removing portions of doped conductive layer 14, second insulator layer 16, and SOI layer 18, and inserting second electrical terminal 30 into the removed portions. Second electrical terminal 30, upon being formed, can be embedded in doped conductive layer 14. By removing portions of second insulator layer 16 and SOI layer 18, second electrical terminal 30 can also be embedded within second insulator layer 16 and SOI layer 18. In addition or alternatively, second electrical terminal 30 can extend through first insulator 12 and substrate 10 by etching portions thereof before forming second electrical terminal 30, if desired. Each of first electrical terminal 20, second electrical terminal 30, and isolation ring 56 (and respective dielectric liners 22, 58) can be formed sequentially or simultaneously in various embodiments. It is understood that the processes described herein can be performed in any conceivable order and combination, e.g., first electrical terminal 20 and isolation ring 56 can be formed together before or after second electrical terminal 30, first and second electrical terminals 20, 30 can be formed simultaneously before or after isolation ring 56, etc.

Figure 6:
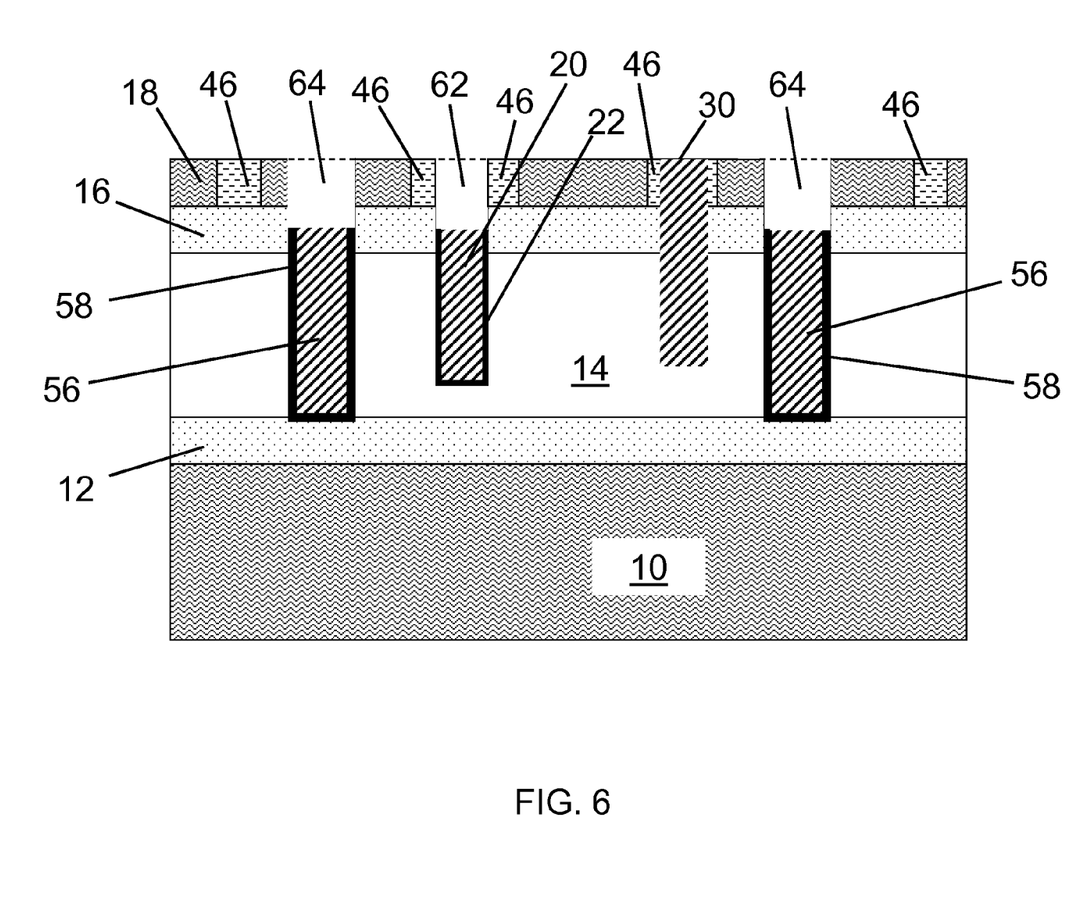

Turning to FIG. 6, embodiments of the present disclosure can also include adding doped conductive materials to first electrical terminal 20 and/or isolation ring 56. For example, a terminal recess 62 can be formed by removing a portion of first electrical terminal 20 and first dielectric liner 22 by any currently known or later developed process of removing a material (e.g., applying photomask 50 (FIG. 3) and etching to a particular depth). A trench recess 64 can additionally or alternatively be formed by removing a portion of isolation ring 56 and second dielectric liner 58 by any currently known or later developed process for removing materials from an IC structure. Terminal recess 62 and/or trench recess 64 can be used as locations for inserting other conductive materials, including doped conductive materials, as described herein. Alternatively, non-doped semiconductor materials can be added to terminal recess 62 and/or trench recess 64, which can then be doped in situ by any currently known or later developed doping process. It is understood that semiconductor materials formed according to the process discussed herein can be pre-doped, or can be doped after being added to a wiring structure of a fuse component.

Figure 7:
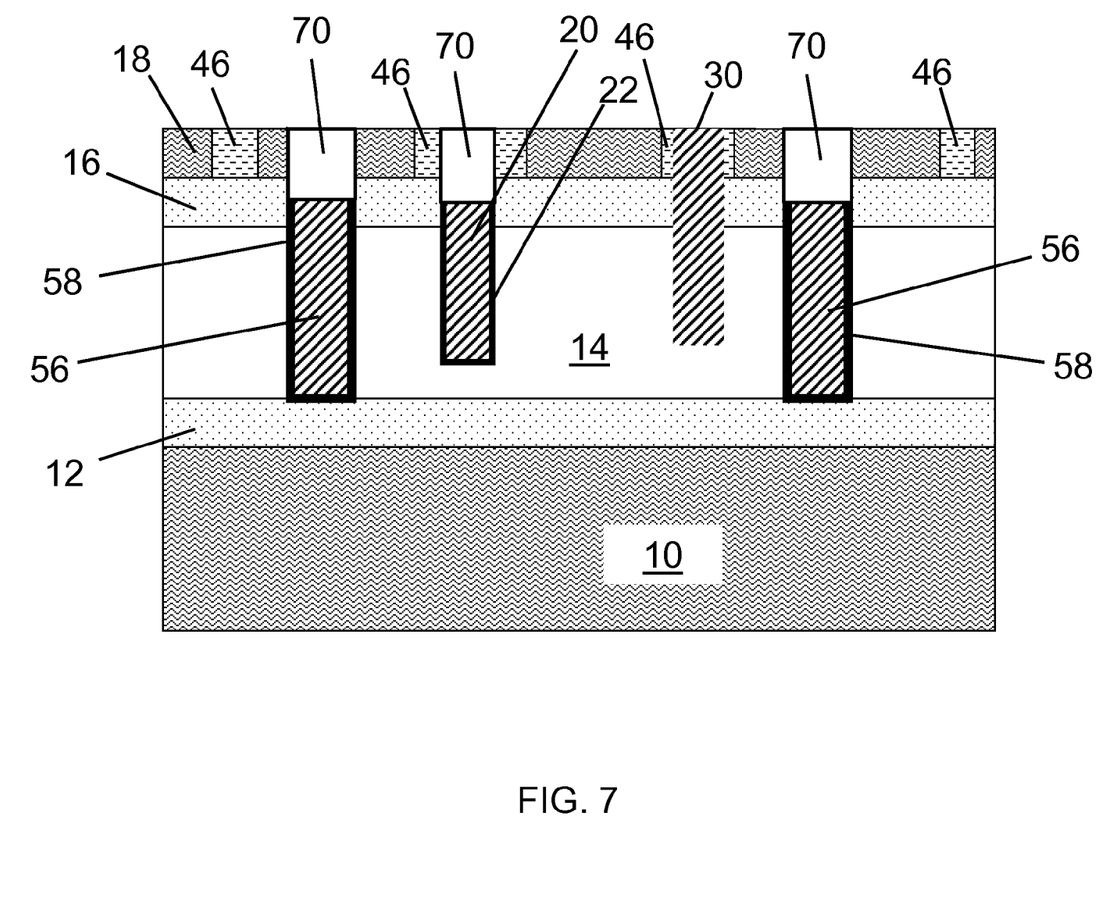

As shown in FIG. 7, a doped conductive material 70 can be formed (e.g., by being deposited) within terminal recess 62 and/or trench recess 64 (FIG. 6). Doped conductive material 70 can be composed of the same material or a similar material as doped conductive layer 14 (e.g., polysilicon, silicon germanium, or a conductive organic material). Further, doped conductive material 70 can be doped to have the same polarity as doped conductive layer 14. Introducing doped conductive material 70 to first electrical terminal 20 and/or isolation ring 56 can improve the conductivity and performance of the resulting fuse component. After doped conductive material 70 is formed, excess material can be removed by polishing or any other currently known or later developed process for removing excess materials from an IC structure.

Methods of the present disclosure can also include forming a transistor 90. A "transistor" is an electrical component with at least three terminals: a gate, a source, and a drain. Parts of a semiconductor material can be used to form the source and drain terminals of a transistor. When a gate voltage $V_g$ from a transistor power supply 91 is applied to the gate terminal of a transistor, the semiconductor between the source and drain terminals can become electrically active, thereby forming a "conductive channel." Thus, transistors can be used as an electrically activated and deactivated switch. A channel region 92 of transistor 90 can be formed within a region of SOI layer 18 and may include a source terminal and a drain terminal, as described herein. Transistor 90 can also include a gate terminal coupled to transistor power supply 91, which can render channel region 92 conductive or non-conductive as desired. Transistor 90 can allow a fuse component according to the present disclosure to be activated or deactivated. For example, channel region 92 in a non-conductive state can prevent electrical current from reaching first electrical terminal 20. However, when a voltage is applied to the gate of transistor 90, electrical currents can flow through channel region 92 to reach first electrical terminal 20 and degrade first dielectric liner 22.

Figure 8:
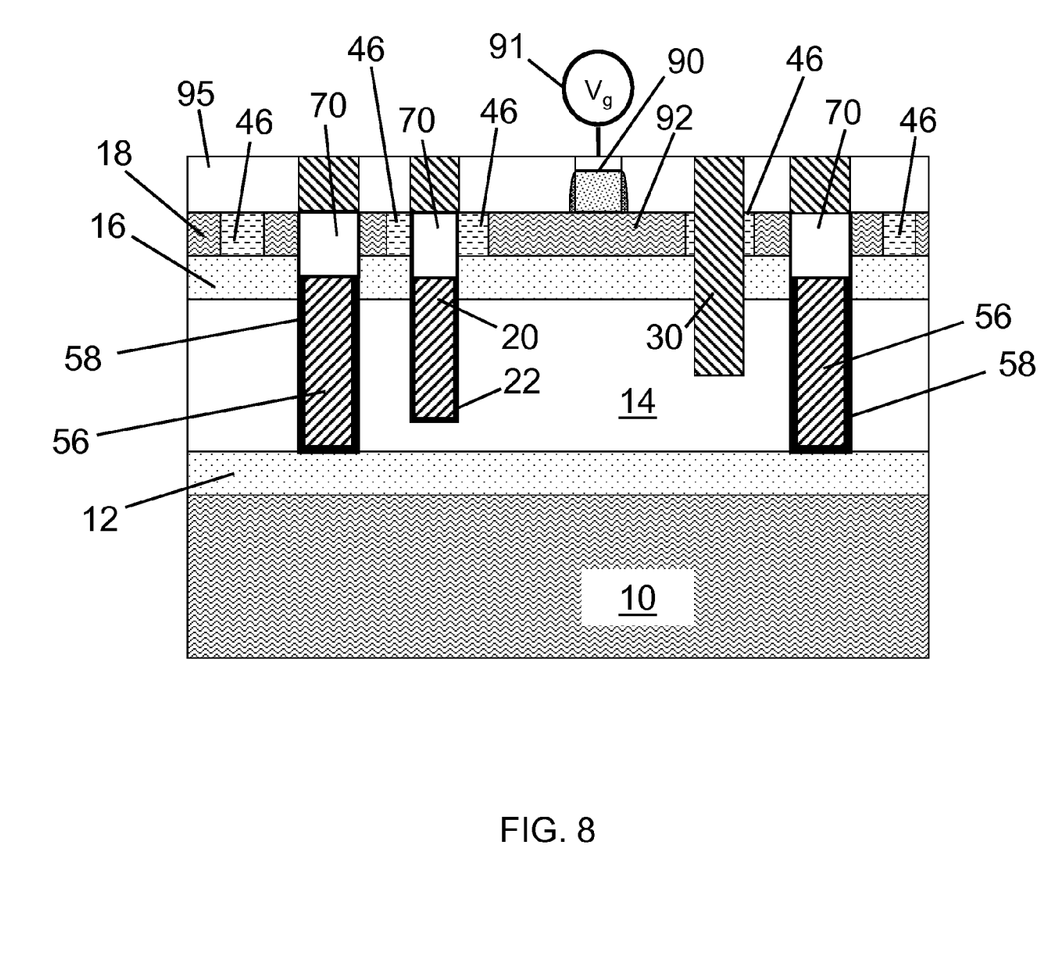

Turning to FIG. 8, embodiments of the present disclosure can also include forming other components of a fuse structure. An interlayer dielectric 95 can be formed by any currently known or later developed process of forming or depositing an insulative material on an IC structure. Similar to other insulative materials discussed herein, interlayer dielectric 95 can substantially block the flow of electric current between two distinct layers of an IC structure.

Figure 9:
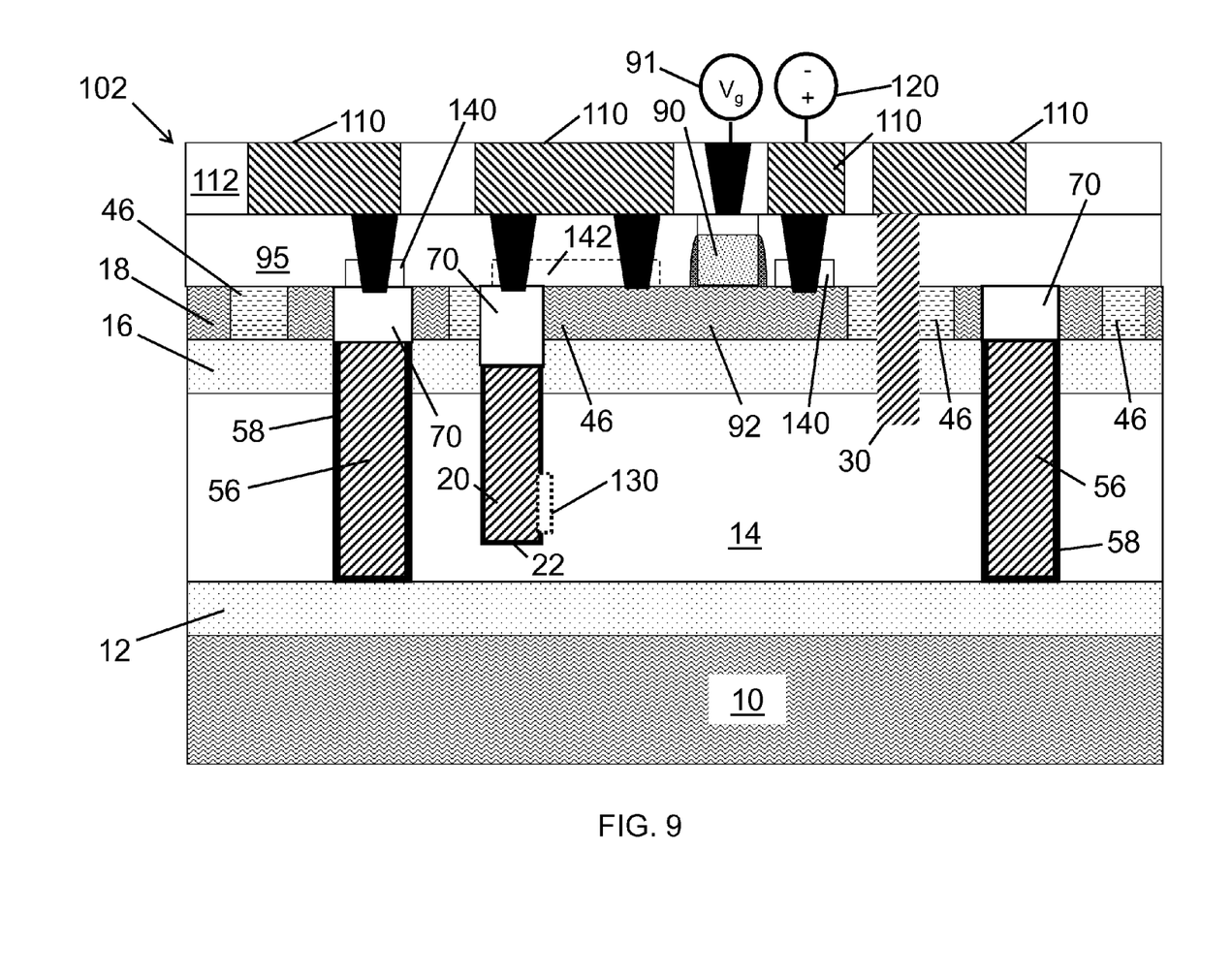
FIG. 9 shows a cross-sectional side view of a fuse component according to an embodiment of the present disclosure.
Figure 10:
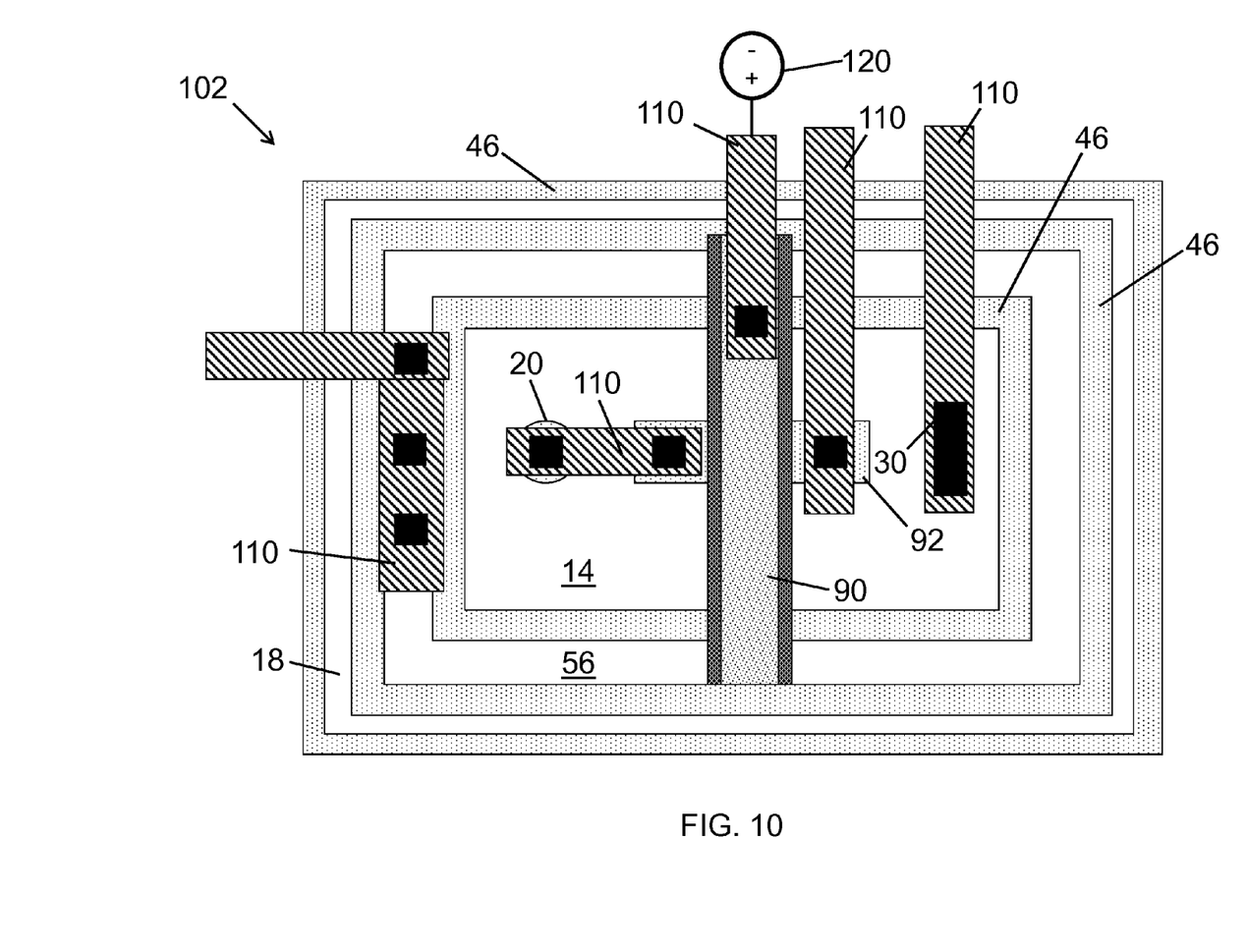
FIG. 10 shows a top-down view of a fuse component according to an embodiment of the present disclosure.

Interlayer dielectric 95 can be composed of, e.g., an insulating material such as an oxide, which can be deposited, bonded, or otherwise placed onto SOI layer 18 and structures coupled thereto, including transistor 90. FIGS. 9 and 10 illustrate other materials which can be coupled to transistor 90 and the components formed in processes discussed herein, which may together form a completed fuse structure 102 (FIG. 9) as described herein.

The foregoing drawings show some of the processing associated according to several embodiments of this disclosure. In this regard, each represents a process associated with embodiments of the method described. It should also be noted that in some alternative implementations, the acts noted in the drawings or blocks may occur out of the order noted in the figure or, for example, may in fact be executed substantially concurrently or in the reverse order, depending upon the act involved. Also, one of ordinary skill in the art will recognize that additional drawings that describe the processing may be added.

Two views of a fuse component 102 according to an embodiment of the present disclosure are shown by way of example in FIGS. 9 and 10. FIG. 9 illustrates a cross-sectional side view of fuse component 102 and its wiring structure, and FIG. 10 provides a top-down view of fuse component 102. First electrical terminal 20, second electrical terminal 30, isolation ring 56, and/or doped conductive material 70 can be electrically coupled to a metal wire 110 of an IC structure. In addition, first electrical terminal 20 can be coupled to transistor 90, which can also be referred to as a "control transistor" or a "control field effect transistor (FET)." Each metal wire can be formed within a dielectric layer 112 by removing portions of dielectric layer 112 and forming each metal wire 110 (e.g., by deposition) within dielectric layer 112. The total number of layers in an IC structure which include metal wires 110 can vary between embodiments, and may include, for example, four to six layers or as many as, in a further example, sixteen layers. The various layers can be designated by the "M" nomenclature, with each metal layer being identified successively as M1, M2, M3, etc. Metal wire 110 generally may be composed of a conductive material or metal, such as copper, aluminum, silver, etc. and may be coupled to other electrical components as desired. Metal wire 110 can couple the structure of fuse component 102 to other electrical components and structures. In particular, metal wire 110 may couple a source or drain terminal of channel region 92 to a power supply 120. Advantages offered by wiring structures of fuse component 102 discussed herein can include, e.g., the ability to program a fuse structure using highly biased power supplies. As an example, power supply 120 coupled to channel region 92 may have a magnitude of at least approximately 2.0 V, which may be in the form of a negative voltage or a positive voltage. In addition, the voltage from power supply 120 can be much higher, as may be required to degrade first dielectric liner 22. The voltage for degrading first dielectric liner 22 can be increased by design in order to decrease the size of isolation ring 56 as needed. Thus, isolation ring 56, first insulator layer 12, and second insulator layer 16 together can form a three-dimensional isolation structure for fuse component 102, as these structures and/or second dielectric liner 42 will not degrade when subjected to the voltage yielded from power supply 120. Thus, fuse components with wiring structures according to the present disclosure can be programmed with a broader range of voltage biases than those that may be available with other fuse components without affecting other circuits on the same chip.

As shown in FIG. 10, isolation ring 56 can be formed in a conductive loop or "moat" shape to enclose a cross sectional area of fuse component 102. Specifically, isolation ring 56 can enclose a cross sectional area which includes first electrical terminal 20, second electrical terminal 30, and doped conductive layer 14. The structure of FIG. 10 can be used to structurally isolate fuse component 102 from other components within the same IC structure, and to protect fuse component 102 from electrical currents generated by other components. As discussed herein, electrically programming or "fusing" fuse component 102 can include degrading portions of first dielectric liner 22 to create an electrically conductive region 130 adjacent to doped conductive layer 14. As shown in both FIG. 9 and FIG. 10, power supply 120 may be electrically coupled to first electrical terminal 20, e.g., through transistor 90.

When electric current is permitted to flow to first electrical terminal 20 (e.g., by applying a gate voltage $V_g$ from transistor power supply 91 to the gate terminal of transistor 90 and rendering channel region 92 active), first electrical terminal 20 adjacent dielectric liner 22 can become electrically charged. First dielectric liner 22, having a dielectric constant of at least approximately 3.9 and a thickness of between approximately 1 nm and approximately 10 nm may degrade in response to a high electrical potential on the side of first electrical terminal 20. The degradation of first dielectric liner 22 can form a conductive region 130 positioned between first electrical terminal 20 and doped conductive layer 14. Conductive region 130 can allow electric current from first electrical terminal to travel through doped conductive layer 14 to reach second electrical terminal 30. As a result, fuse component 102 can function as an "antifuse," a component which prevents the flow of electrical current until being programmed, e.g., by electrically degrading first dielectric liners 22. Although second dielectric liner 58 may be composed of a similar material to first dielectric liner 22, second dielectric liner 58 may not degrade under a bias voltage applied to isolation ring 56.

In an embodiment, the flow of electrical current across metal-to-silicon electrical couplings can be increased by forming one or more silicide regions 140 between metal-based and silicon-based components of fuse component 102. As is known in the art, silicide region 140 can include an alloy of silicon and another metal, and may include, e.g., $TiSi_2$ (titanium silicide), $CoSi_2$ (cobalt silicide), and NiSi (nickel silicide). In addition, a coupling silicide region 142 (shown in phantom) can electrically couple first electrical terminal 20 to channel region 92 of transistor 90. Coupling silicide region 142 can be formed in some embodiments to directly couple first electrical terminal 20 to transistor 90 without adding further electrical connections to metal wire 110 of dielectric layer 112. Forming coupling silicide region 142 can optionally be added to fuse structure 102 to accommodate different manufacturing needs.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A method of fabricating a trench fuse component, the method comprising:
   forming a first insulator layer between a doped conductive layer and an oppositely doped substrate of an integrated circuit (IC) structure, such that no p-n junction exists between the oppositely doped substrate and the doped conductive layer;
   forming a first electrical terminal within the doped conductive layer, wherein the first electrical terminal includes a dielectric liner thereon;
   forming a second electrical terminal within the doped conductive layer; and
   coupling one of a source terminal and a drain terminal of a transistor to one of the first electrical terminal and the second electrical terminal.

2. The method of claim 1, further comprising forming a silicide region to directly couple one of the source terminal and the drain terminal of the transistor to one of the first electrical terminal and the second electrical terminal.

3. The method of claim 1, further comprising:
   forming a second insulator layer adjacent to the doped conductive layer, wherein each of the first electrical terminal and the second electrical terminal are at least partially embedded within the second insulator layer.

4. The method of claim 3, further comprising:
   forming an interlayer dielectric over the second insulator layer, wherein the second electrical terminal is at least partially embedded within the interlayer dielectric; and
   forming an electrical contact within the interlayer dielectric, wherein the formed electrical contact is electrically coupled to the second electrical terminal.

5. The method of claim 1, further comprising:
   forming a doped conductive material within each of the first electrical terminal and the second electrical terminal, wherein each of the doped conductive material and the doped conductive layer have a common polarity.

6. The method of claim 5, wherein one of the doped conductive material and the doped conductive layer includes one of polysilicon and silicon germanium.

7. The method of claim 1, further comprising forming an isolation ring to enclose a cross sectional area of the doped conductive layer, the first electrical terminal, and the second electrical terminal.

8. A method of fabricating a trench fuse component, the method comprising:
   forming a first insulator layer between a doped conductive layer and an oppositely doped substrate of an integrated circuit (IC) structure, such that no p-n junction exists between the oppositely doped substrate and the doped conductive layer;
   forming a first electrical terminal within the doped conductive layer, wherein the first electrical terminal includes a dielectric liner thereon;
   forming a second electrical terminal within the doped conductive layer;
   forming a second insulator layer adjacent to the doped conductive layer, wherein each of the first electrical terminal and the second electrical terminal are at least partially embedded within the second insulator layer;
   forming an interlayer dielectric adjacent over the second insulator layer, wherein the second electrical terminal is at least partially embedded within the interlayer dielectric; and
   forming an electrical contact within the interlayer dielectric, wherein the formed electrical contact is electrically coupled to the second electrical terminal.

9. The method of claim 8, further comprising coupling one of a source terminal and a drain terminal of a transistor to one of the first electrical terminal and the second electrical terminal.

10. The method of claim 8, further comprising forming a coupling silicide region to directly couple one of a source terminal and a drain terminal of a transistor to one of the first electrical terminal and the second electrical terminal.

11. The method of claim 8, further comprising:
    forming a doped conductive material within each of the first electrical terminal and the second electrical terminal, wherein each of the doped conductive material and the doped conductive layer have a common polarity.

12. The method of claim 11, wherein one of the doped conductive material and the doped conductive layer includes one of polysilicon and silicon germanium.

13. The method of claim 8, further comprising forming an isolation ring to enclose a cross sectional area of the doped conductive layer, the first electrical terminal, and the second electrical terminal.

14. A method of fabricating a trench fuse component, the method comprising:
    forming a first insulator layer between a doped conductive layer and an oppositely doped substrate of an integrated circuit (IC) structure, such that no p-n junction exists between the oppositely doped substrate and the doped conductive layer;
    forming a first electrical terminal within the doped conductive layer, wherein the first electrical terminal includes a dielectric liner thereon;
    forming a second electrical terminal within the doped conductive layer; and
    forming a doped conductive material within each of the first electrical terminal and the second electrical terminal, wherein each of the doped conductive material and the doped conductive layer have a common polarity.

15. The method of claim 14, further comprising coupling one of a source terminal and a drain terminal of a transistor to one of the first electrical terminal and the second electrical terminal.

16. The method of claim 14, further comprising forming a silicide region to directly couple one of a source terminal and a drain terminal of a transistor to one of the first electrical terminal and the second electrical terminal.

17. The method of claim 14, wherein one of the doped conductive material and the doped conductive layer includes one of polysilicon and silicon germanium.

18. The method of claim 14, further comprising forming an isolation ring to enclose a cross sectional area of the doped conductive layer, the first electrical terminal, and the second electrical terminal.

19. The method of claim 14, further comprising:
forming a second insulator layer adjacent to the doped conductive layer, wherein each of the first electrical terminal and the second electrical terminal are at least partially embedded within the second insulator layer.

20. The method of claim 19, further comprising:
forming an interlayer dielectric over the second insulator layer, wherein the second electrical terminal is at least partially embedded within the interlayer dielectric; and
forming an electrical contact within the interlayer dielectric, wherein the formed electrical contact is electrically coupled to the second electrical terminal.

* * * * *